(12) United States Patent
Hovel (10) Patent No.: US 8,138,410 B2
(45) Date of Patent: Mar. 20, 2012

(54) OPTICAL TANDEM PHOTOVOLTAIC CELL PANELS

(75) Inventor: Harold J. Hovel, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 12/242,962

(22) Filed: Oct. 1, 2008

(65) Prior Publication Data

US 2010/0078056 A1 Apr. 1, 2010

(51) Int. Cl.
*H02N 6/00* (2006.01)
*H01L 31/042* (2006.01)
*H01L 31/00* (2006.01)

(52) U.S. Cl. .......................... 136/244; 136/261; 136/262

(58) Field of Classification Search .................. 136/262, 136/261, 244
See application file for complete search history.

(56) References Cited

U.S. PATENT DOCUMENTS

| | | | |
|---|---|---|---|
| 4,017,332 A | 4/1977 | James | |
| 4,094,704 A | 6/1978 | Milnes | |
| 4,295,002 A * | 10/1981 | Chappell et al. | 136/244 |
| 4,400,577 A | 8/1983 | Spear | |
| 4,400,868 A | 8/1983 | Antypas | |
| 4,461,922 A | 7/1984 | Gay | |
| 4,638,111 A | 1/1987 | Gay | |
| 4,658,086 A * | 4/1987 | McLeod et al. | 136/249 |
| 4,914,044 A | 4/1990 | Grabmaier | |
| 2004/0118451 A1 | 6/2004 | Walukiewicz | |
| 2006/0180197 A1* | 8/2006 | Gui et al. | 136/255 |

FOREIGN PATENT DOCUMENTS

JP 2001-308354 2/2001

OTHER PUBLICATIONS

Soga, T., et al. "High-Efficiency Monolithic Three-Terminal GaAs/Si Tandem Solar cells Fabricated by Metalorganic Chemical Vapor Deposition," Jpn. J. Appl. Phys. vol. 35 (1996) p. 1401-1404.*
Solartron Technologies, "Wiring solar modules and batteries," <www.partsonsale.com/learnwiring.htm>, archived 2003.*

* cited by examiner

*Primary Examiner* — Basia Ridley
*Assistant Examiner* — Allison Bourke
(74) *Attorney, Agent, or Firm* — Graham S. Jones, II; Louis J. Percello; Robert M. Trepp (57) ABSTRACT

A solar energy conversion device comprises a vertical stack of at least two panels stacked in a hierarchy from an upper panel to a lower panel with each of the panels including a matching array of solar cells having a different energy bandgap from other panels of solar cells in the vertical stack of panels. Each panel in the vertical stack may be arranged with one of the panels having solar cells with a higher energy bandgap situated in the hierarchy and in the stack above others of the panels containing solar cells with a lower energy bandgap. The top surface of the device is adapted for receiving solar energy incident upon the uppermost panel. Each upper panel absorbs a fraction of sunlight with larger solar photon energies larger than the energy bandgap thereof and transmits solar photons with photon energies less than larger solar photon energies to a remaining one of the panels lower in the hierarchy and positioned lower in the stack.

11 Claims, 7 Drawing Sheets

OPTICAL TANDEM PHOTOVOLTAIC CELL PANELS

CROSS-REFERENCE TO RELATED APPLICATIONS

This application contains subject matter which is related to the subject matter of the following commonly assigned copending applications, including U.S. patent application Ser. No. 12/243,995, filed on 2 Oct. 2008 of Hovel entitled "Quantum Well Gap/Si Tandem Photovoltaic Cells"; and U.S. patent application Ser. No. 12/246,511, filed on 7 Oct. 2008 of Hovel entitled "Tandem Nanofilm Photovoltaic Cells Joined By Wafer Bonding." Each of the above listed applications is hereby incorporated herein by reference in its entirety.

BACKGROUND OF THE INVENTION

This invention relates to photovoltaic: types of Energy Conversion Devices (ECDs), and more particularly to the photovoltaic cell, e.g. cell, type of ECD, which consists of a stack of panels with an array of photovoltaic cells mounted thereon.

DEFINITIONS

Electromagnetic Radiation to Electric Energy Conversion Device (EREECD): A device that reacts with electromagnetic (optical) radiation to produce electrical energy Optical Radiation to Electric Energy Conversion Device (OREECD): A device that reacts with optical electromagnetic radiation to produce electrical energy. Such a device could be a radiation absorbing device, e.g. a photodetector/counter, photovoltaic cell (solar cell) or a radiation-driven electrolysis cell.

Optoelectronic Energy Device (OED): A device that reacts with optical radiation to produce electrical energy with an electronic device.

Photovoltaic cell: An electrical device (e.g. a semiconductor) that converts light or other radiant energy, in the range from ultraviolet to infrared radiation, incident on its surface into electrical energy in the form of power/voltage/current which has two electrodes, usually a diode with a top electrode and a bottom electrode with opposite electrical polarities. The photovoltaic cell produces direct current which flows through the electrodes. As employed herein, the term photovoltaic cell is generic to cells which convert radiant energy into electrical energy including EREECDs, OREECDs, and OEDs as defined above.

Solar cell: An electrical photovoltaic device (e.g. a semiconductor) that converts light incident on its surface into electrical energy which has two electrodes, usually a diode with a top electrode and a bottom electrode with opposite electrical polarities. The solar cell produces direct current which flows through the electrodes. As employed herein, the term solar cell is generic to cells which convert radiant energy into electrical energy.

Panel: A structure formed on a substrate formed of glass, quartz, metal, or other material with multiple solar cells mounted thereon which may include means of electrical input and output.

TCO (Transparent Conducting Oxide): an optically transparent electrical conductor.

Stack: A cascade of panels mounted on top of each other arranged so that sunlight is incident on the uppermost panel and a portion thereof filters down or passes through to the underlying panels.

Solar spectrum: The amount of solar energy available as a function of the wavelength of the incident photons, where the energy of each photon is 1.24 volts divided by the wavelength in microns.

Spectral response: The amount of electrical current produced by a solar cell at the wavelength of an incident photon.

Electrically parallel: Solar cells with a connection of the top electrodes and bottom electrodes with the top electrodes and bottom electrodes of other solar cells producing additive solar cell currents.

Electrically series: The connection of the top electrode of a solar cell to the bottom electrode of another solar cell so that the voltages produced by the cells add together.

Optically series: An arrangement whereby light incident on one device, e.g. a semiconductor, is partly absorbed in that device and the remainder is passed down to other devices (e.g. semiconductors.)

Tandem solar cells: A stack of solar cells in which some incident light is absorbed by higher-lying cells and the portion not absorbed is passed down to lower-lying cells.

Bandgap or Energy Bandgap: The characteristic energy profile of a semiconductor device that determines its electrical performance, current and voltage output, which specifically comprises the difference between the valence band and conduction band of the semiconductor.

p/n junction: A diode formed by the connection between a p-type and an n-type semiconductor.

Tunnel junction: A p/n junction doped so highly as to exhibit ohmic electrical behavior, rather than diode behavior.

Contact grids: Metal lines connected together to gather current generated by a solar cell with low electrical resistance and to allow incident sunlight to reach most of the surface of the solar cell which is a semiconductor device.

Load: A device using power, e.g. an appliance, heater, television, etc. requiring a supply of power.

Base: The main body of a solar cell, lying below the junction boundary in a semiconductor.

By-pass diode: A diode that is placed across a group of solar cells to shunt excess current and therefore prevent damage to cells which become shaded from light while others in the group remain illuminated.

The purpose of fabricating tandem solar energy conversion devices using multiple kinds of solar cells with different bandgaps is that solar cells are more efficient in converting photon energies close to their bandgap than they are at converting photon energies much higher than their bandgap. By subdividing the solar spectrum into portions and using multiple solar cells optimized to convert solar energy into electrical energy within an appropriate portion of the spectrum, the overall efficiency is increased considerably.

Certain types of tandem solar cells are well known in the art. The most common variety is the monolithic form in which a p/n junction is formed in a first semiconductor followed by a tunnel junction grown by epitaxy, a second junction of a higher bandgap semiconductor also grown by epitaxy. If desired, a second tunnel junction and a third p/n junction of an even higher bandgap semiconductor are also grown by epitaxy. Each semiconductor p/n junction located above other semiconductor p/n junctions in a tandem stack thereof absorbs the light of photon energy larger than its bandgap and transmits the remainder of the light of photon energy below that bandgap to the semiconductor p/n junctions lying therebelow. The purpose of the tunnel junctions is to act as low resistance "ohmic" contacts to connect the separate p/n junctions in series, causing the voltages of each cell to add to the others. Since the junctions are in series, the currents generated by each p/n junction solar cell in the stack must be the same or power and energy conversion efficiency will be lost.

SUMMARY OF THE INVENTION

None of the prior art includes the steps of connecting the solar cells on separate panels of a tandem structure so that each panel in the stack has substantially the same voltage or current output, allowing the panels to be connected in series to add voltages or parallel to add currents, whereby the finished tandem energy conversion device has only two electrodes (one output electrode usually connected to electrical "ground" and one other output electrode) so that the energy conversion device can be connected to a single load.

In accordance with this invention a photovoltaic device comprises stacks of photovoltaic cells, e.g. photovoltaic (e.g. solar) Energy Conversion Device (ECD) cells, with each stack consisting of a plurality of photovoltaic panels with an array of photovoltaic cells, e.g. solar cells, mounted on each thereof so that when radiant (solar) energy is incident on an uppermost panel a portion of the radiant (solar) energy spectrum is absorbed thereby producing electrical energy. Each successive ones of the stacked panels receives portions of the radiant (solar) energy spectrum not absorbed by an upper panel. The energy which is transmitted to a panel of photovoltaic cells lower down in the stack is absorbed thereby producing electrical energy.

In one aspect of this invention, panels higher in the stack are mounted with photovoltaic (solar) cells having higher energy bandgaps and subsequent panels lower down in the stack are mounted with photovoltaic (solar) cells having lower energy bandgaps. The photovoltaic (solar) cells are connected in electrical series and parallel such that each panel produces a desired voltage and current output and the panels are electrically connected together such that the amount of the incident solar power converted to useful electricity is greater than would be produced by any one panel alone.

In accordance with this invention, a photovoltaic (solar) energy conversion device is provided including a vertical stack of at least two panels stacked in a hierarchy from an upper panel to a lower panel with each of the panels including a matching array of photovoltaic (solar) cells having a different energy bandgap from other panels of photovoltaic (solar) cells in the vertical stack of panels. Each of the panels in the vertical stack is arranged with one of the panels having photovoltaic (solar) cells with a higher energy bandgap situated in the hierarchy and in the stack above others of the panels containing photovoltaic (solar) cells with a lower energy bandgap. A top surface of the device is adapted to receive radiant (solar) energy incident upon the uppermost panel.

Each of the upper panels absorbs a fraction of sunlight with larger solar photon energies larger than the energy bandgap thereof, and each upper panel transmits solar photons with photon energies less than the larger photovoltaic (solar) photon energies to a remaining one of the panels lower in the hierarchy and positioned lower in the stack. Preferably the photovoltaic (solar) cells in each panel are connected in series electrically; and the panels are connected in parallel. Alternatively it is preferred that the photovoltaic (solar) cells in each panel are connected electrically in parallel and the panels are connected in series. Preferably the number of solar cells on each of the panels connected in series electrical arrangement is equal to a desired output voltage of each panel divided by the operating voltage of each the photovoltaic (solar) cells on each panel. It is also preferred that a stack of two panels with GaAs photovoltaic (solar) cells is mounted on the upper panel and silicon solar cells are mounted on the lower panel.

In another embodiment, the upper panel is mounted with photovoltaic (solar) cells taken from the group of GaAs, GaInP, GaAsP, amorphous silicon, CdTe, and CdZnTe; and the lower panel is mounted with photovoltaic (solar) cells selected from the group consisting of crystalline silicon, polycrystalline silicon, copper indium gallium diselenide, germanium, gallium indium nitride, and gallium indium arsenide nitride.

It is also preferred that a stack of three of the panels includes an upper panel, a middle panel and a lower panel arranged from top to bottom in that order; with the upper panel being mounted with photovoltaic (solar) cells whose energy bandgap is larger than 1.7 electron volts, with the lower panel being mounted with photovoltaic (solar) cells with an energy bandgap is less than 1.1 electron volts, and with the middle panel being mounted with photovoltaic (solar) cells whose bandgap lies between bandgaps of the cells mounted on the upper panel and lower panels. Preferably the photovoltaic (solar) cells in each panel are juxtaposed and either separated by a dielectric spacer; or butted together.

In accordance with another aspect of this invention, a photovoltaic (solar) energy conversion device includes at least two panels arranged for direction of photovoltaic (solar) energy to be incident upon an uppermost panel in the stack with each of the panels containing an array of photovoltaic (solar) cells having a different energy bandgap. The panels are arranged in a vertical stack with the panels with higher energy bandgap photovoltaic (solar) cells situated above the panels with lower energy bandgap photovoltaic (solar) cells; and with each panel being adapted to absorb a fraction of sunlight with photovoltaic (solar) photon energies larger than its energy bandgap and being adapted to transmit photovoltaic (solar) photons with energies less than its energy bandgap to the panels lower in the stack.

Preferably the photovoltaic (solar) cells in each panel are connected electrically in series and the panels are connected in parallel; or the photovoltaic (solar) cells in each panel are connected electrically in parallel and the panels are connected in series. Preferably, the number of photovoltaic (solar) cells on each panel connected in parallel electrical arrangement is equal to a desired output current of each panel divided by operating current of each the solar cells on each panel.

The transparency of the upper panels and solid lower-most panel provides that some fraction of light transmitted through upper-lying panels may be reflected back upward by lower-lying panels to result in additional power output and lower losses. The benefit of such upward reflection depends on the amount of light which penetrates each panel and the reflection properties of the lower-lying panels.

It is preferred that a stack of two panels with GaAs photovoltaic (solar) cells is mounted on the upper panel and silicon solar cells are mounted on the lower the panel. Alternatively, an upper panel is mounted with solar cells taken from the group of GaAs, GaInP, GaAsP, amorphous silicon, CdTe, and CdZnTe; and the lower the panel is mounted with photovoltaic (solar) cells taken from the group of crystalline silicon, polycrystalline silicon, copper indium gallium diselenide, germanium, gallium indium nitride, or gallium indium arsenide nitride.

In accordance with still another aspect of this invention, three of the panels of photovoltaic (solar) cells in a stack include an upper panel, a middle panel and a lower panel arranged in that order from top to bottom. The upper panel is mounted with solar cells whose energy bandgap is larger than about 1.7 electron volts. The lower panel is mounted with solar cells whose energy bandgap is less than about 1.1 electron volts. The middle panel is mounted with solar cells with a bandgap which lies between the bandgaps of the cells mounted on the upper panel and the lower panel. Preferably, a group of the photovoltaic (solar) cells is designated as a unit and a protective by-pass diode is included with each unit. Preferably the photovoltaic (solar) cells in each panel are separated by a dielectric spacer; or the photovoltaic (solar) cells in each panel are butted together.

The invention and objects and features thereof will be more readily apparent from the following detailed description and appended claims when taken with the drawings.

The detailed description which follows explains the preferred embodiments of the invention, together with advantages and features with reference to the drawings.

DETAILED DESCRIPTION OF PREFERRED EMBODIMENTS OF THE INVENTION

Tandem Solar Panels

Figure 1:
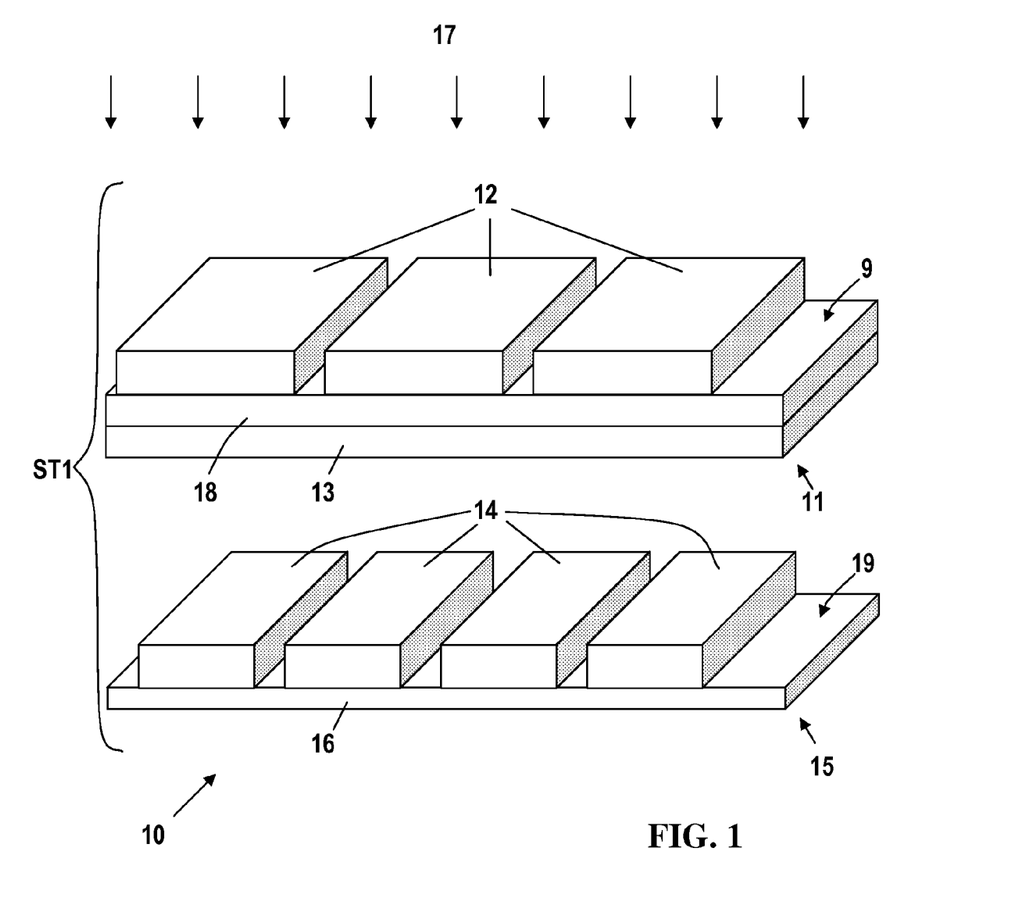
FIG. 1 shows a Tandem Energy Conversion (TEC) device in accordance with this invention consisting of two stacked panels of solar cells.

FIG. 1 shows a Tandem Energy Conversion (TEC) solar cell device 10 consisting of a stack ST1 of a tandem arrangement of two solar cell panels (as examples of panels of photovoltaic cells) including an upper solar cell panel 11 with three upper solar cells 12 and a lower solar cell panel 15 with lower solar cells 14. As shown, the lower solar cell panel 15 lies below the upper solar cell panel 11, but the structure may be inverted if electromagnetic energy is supplied from therebelow. The upper solar cell panel 11 comprises a transparent top substrate 13 having a top surface on which a Transparent Conducting Oxide (TCO) pad 18 is mounted. The TCO pad 18 has a top surface on which the three, wide, upper solar cells 12, which are diodes are juxtaposed, side-by-side, in parallel with narrow spaces therebetween.

Only three upper solar cells 12 are shown for convenience of illustration, but many more are likely to be employed. The upper solar cells 12 generate direct current electricity with electrically conductive electrodes, i.e. anodes and cathodes on opposite surfaces thereof adapted for connection in an electric circuit. There is an upper electrode on the top surface of each of the upper solar cells 12 and there is a lower electrode on the bottom surface of each of the upper solar cells 12.

As is the case for all diodes, as is well understood by those skilled in the art, the upper and lower electrodes of the solar cells (diodes) have opposite polarities. For example all of the upper electrodes may be cathodes, which have negative polarities, and in that case, all of the lower electrodes will be anodes which have positive polarities or the reverse depending upon how they are to be connected in a circuit. The widths of the narrow spaces between the upper solar cells 12 are minimized so that little if any light passes between them. The TCO layer 18 is composed of a material which allows light which is not absorbed by the set of several, upper solar cells 12 to be transmitted therethrough. Then the light which was not absorbed by the upper solar cells 12 will be transmitted in turn through the transparent top substrate 13 and down onto the lower solar cell panel 15.

In particular, the transparent TCO layer 18 may be composed of an electrically conductive material such as indium-tin oxide, tin oxide, zinc oxide, and the like. The lower electrodes of the solar cells 12 are bonded to the TCO layer 18, i.e. in electrical and mechanical contact therewith; and the TCO layer 18 can be used as a lower electrode to make an electrical connection at a location thereon such as the exposed end 9 of the TCO layer 18.

The lower solar cell panel 15 includes a bottom substrate 16, having a top surface with several lower solar cells 14 (shown as only four for convenience of illustration) formed juxtaposed in parallel, with narrow spaces therebetween on the top surface of the bottom conductive substrate 16. Only four lower solar cells 14 are shown for convenience of illustration, but many more are likely to be employed. The four lower solar cells 14, which are narrower than the upper solar cells 12, are also diodes with upper and lower electrodes having opposite polarities on the top surface and the bottom surfaces thereof.

For example, as described above for the upper solar cell panel 11, it is preferred that all of the upper electrodes may have negative polarities and all of the lower electrodes may have positive polarities or the reverse and that may be altered, depending upon how they are to be connected in a circuit as will be well understood by those skilled in the art. The conductive, bottom substrate 16 does not need to be transparent and can be composed of an electrically conductive material such as metal which can be used as a lower electrode to make an electrical connection at a location thereon such as the exposed end 19 of the bottom substrate 16.

Radiant energy 17, which may be light, sunlight, or other radiant energy from a solar or other energy source is shown directed downwardly to be incident upon the stack ST1 including the top surfaces of the upper solar cells 12. The majority of the portion of the solar spectrum with photon energies above the bandgap of the upper solar cells 12 is absorbed thereby and is converted thereby into electrical energy.

The portion of the solar spectrum with photon energies below the bandgap of the upper solar cells 12 is transmitted down through the upper solar cells 12, the TCO layer 18 and the transparent top substrate 13 down onto the top surfaces of the lower solar cell panel 15 and onto the lower solar cells 14 mounted thereon where the portion of the solar spectrum with energies above the bandgap of the lower cells 14 is converted into electrical energy. The spaces between the upper solar cells 12 and the lower solar cells 14 have minimum widths so that a maximum amount of sunlight is collected for the minimum cell area; otherwise the spaces between the upper and lower solar cells 12 and 14 would constitute efficiency losses.

Only three upper solar cells 12 are shown on the upper solar cell panel 11 and only four lower solar cells 14 are shown on the lower solar cell panel 15 for convenience of illustration. In practice, the number of cells on each of the solar cell panels 11 and 15 is determined by the desired voltage output of the panel, divided by the output voltage of the individual cells thereon.

Multiple Tandem Solar Panels

Figure 2:
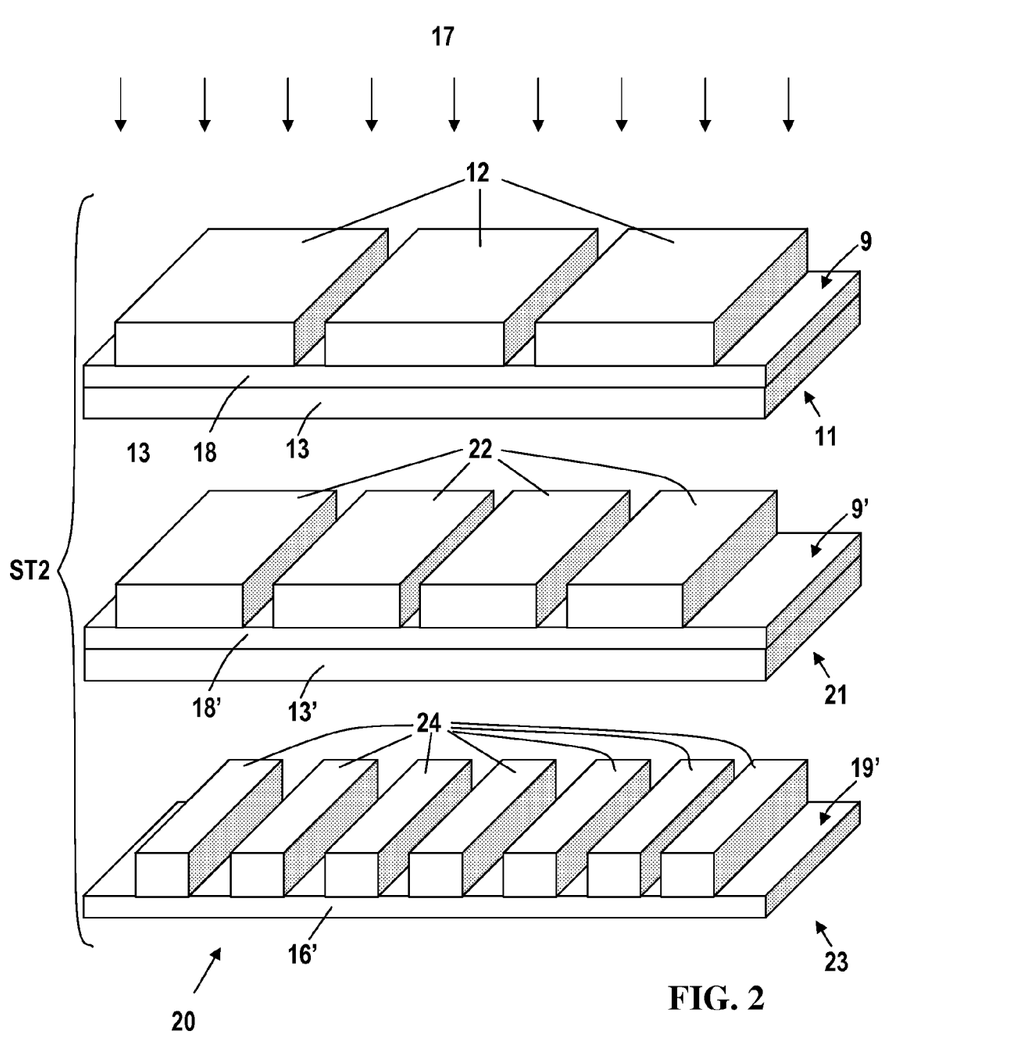
FIG. 2 shows a Tandem Energy Conversion (TEC) device in accordance with this invention consisting of three stacked panels of solar cells.

FIG. 2 shows a Tandem Energy Conversion (TEC) solar cell device 20 consisting of another stack ST2 of multiple (three) solar cell panels 11, 21 and 23 with three sets of solar cells 12, 22, and 24, which are diodes, mounted thereon, respectively. The solar cells 12, 22, and 24 are diodes which have both upper electrodes formed on the top surfaces thereof and lower electrodes formed on the bottom surfaces thereof, as will be well understood by those skilled in the art. The upper electrodes and the lower electrodes would usually have opposite polarities. For example all of the upper electrodes may have negative polarities and all of the lower electrodes may have positive polarities or the reverse but are consistent.

The upper panel 11 and the middle panel 21 are composed of transparent top substrate 13 and transparent middle substrate 13' on the bottom of the top and middle solar cell panels 11 and 21 with an upper TCO layer 18 and an intermediate TCO layer 18', respectively, formed on the top surfaces thereof. The upper TCO layer 18 can be used as a lower electrode to make an electrical connection at a location thereon such as the exposed end 9 thereof. Similarly, the intermediate TCO layer 18' can be used as a lower electrode to make an electrical connection at a location thereon such as the exposed end 9' thereof.

As in FIG. 1 there are a few upper solar cells 12, e.g. three, mounted on the top surface of the TCO layer 18 of the upper panel 11 with their lower electrodes bonded to the intermediate TCO layer 18 i.e. in electrical and mechanical contact therewith. There are more, usually smaller intermediate, middle, solar cells 22, shown as only four cells for convenience of illustration, formed on the top surface of the intermediate TCO layer 18' of the middle panel 21 of middle solar cells 22.

Even more lower solar cells 24, shown as only seven (for convenience of illustration), are formed on the top surface of the conductive substrate 16' of the bottom panel 23 of solar cells 24. As with FIG. 1, the bottom substrate 16' does need not be transparent and can be composed of an electrically conductive material such as metal which can be used as a lower electrode to make an electrical connection at a location thereon such as the exposed end 19' of the bottom substrate 16'. Sunlight, light, or other radiant energy 17 is incident on the upper solar cells 12 and the exposed top surfaces of the TCO layer 18 of the upper panel 11, as in FIG. 1.

The solar cells shown in FIGS. 1 and 2 decrease in size on lower panels in order to result in the same net voltage output from each panel, a requirement for connecting the panels in parallel. This requirement on device size is not necessary if panels are connected in series where the current output must be the same instead of the voltage output.

The majority of the portion of the solar spectrum in the light, sunlight or other radiant energy source 17 with photon energies higher than the bandgap of the upper solar cells 12 of the upper panel 11 is absorbed by the upper solar cells 12 and is converted into electrical energy. However, the portion of the solar spectrum with photon energies below the bandgap of the upper cells 12 is transmitted through the upper solar cells 12, the TCO layer 18 and the transparent top substrate 13 down to panel 21 where the portion of the solar spectrum with energies above the bandgap of the middle solar cells 22 is converted into electrical energy.

The portion of the solar spectrum above the bandgap of the middle solar cells 22 in the middle panel 21 is absorbed by the solar cells 22. The remainder of the energy, i.e. the portion of the solar spectrum with photon energies below the bandgap of the middle solar cells 22 is transmitted through the intermediate TCO layer 18' and the transparent middle substrate 13' down towards the bottom cells 24 on the bottom panel 23, where solar energy absorbed thereby is converted into electrical energy.

The solar cells on each panel do not need to be all the same size. What is required is to connect the cells on each panel in either electrical series, parallel, or combinations of series and parallel so that the desired output is obtained. It is also possible to use different bandgap solar cells on a single panel if a particular advantage is obtained by doing so; however, generally it is desirable to mount solar cells of the same bandgap on each individual panel.

Solar Cell Materials with Different Bandgaps

A range of materials is available for use as the solar cells for each panel. For example, the upper panel 11 in FIG. 1 can be mounted with cells whose bandgap equals or exceeds 1.4 electron-volts (eV) such as amorphous Silicon (aSi), Gallium Arsenide (GaAs), Cadmium Zinc Telluride (CdZnTe), Gallium Indium Phosphide (GaInP), or Cadmium Telluride (CdTe), while the lower panel can be mounted with cells whose bandgaps are 1.1 eV or less such as silicon (Si), germanium (Ge), Indium-Gallium Arsenide (InGaAs), Gallium Indium Nitride (GaInN), Gallium Indium Arsenide Nitride (GaInAsN), or Copper-Indium-Gallium-diSelenide (CIGS). Other materials can be employed having bandgaps which are within the preferred ranges.

For the upper cells 12 of FIG. 2, materials with yet higher bandgaps such as equal to or greater than 1.7 eV are preferred such as aSi, Gallium-Indium Phosphide (GaInP), aluminum gallium phosphide (AlGaP), Gallium Aluminum Arsenide (GaAlAs), and Gallium Arsenide Phosphide (GaAsP), where the bandgaps can be tailored by the compositions of the semiconductor alloys.

For the middle panel 21, the middle solar cells 22 can be made with semiconductors whose bandgaps lie below 1.7 eV but above 1.0 eV such as Silicon (Si), Gallium Arsenide (GaAs), Gallium Indium Arsenide (GaInAs), CIGS, and Gallium Indium Arsenide Nitride (GaInAsN).

For the lower panel 23, solar cells can be made with semiconductors with bandgaps below 1.1 eV such as GaInAs, silicon-germanium (SiGe), Ge, gallium antimonide (GaSb), and alloys of these materials, where the bandgap is determined by the alloy composition.

As in FIG. 1, the number of cells 12, 22, and 24 on panels 11, 21, and 23 are determined by the desired voltage output of the panels and the voltage outputs of the individual cells.

TEC Solar Cell Panels with Solar Cells Connected in Series on Separate TCO Pads

Figure 3A:
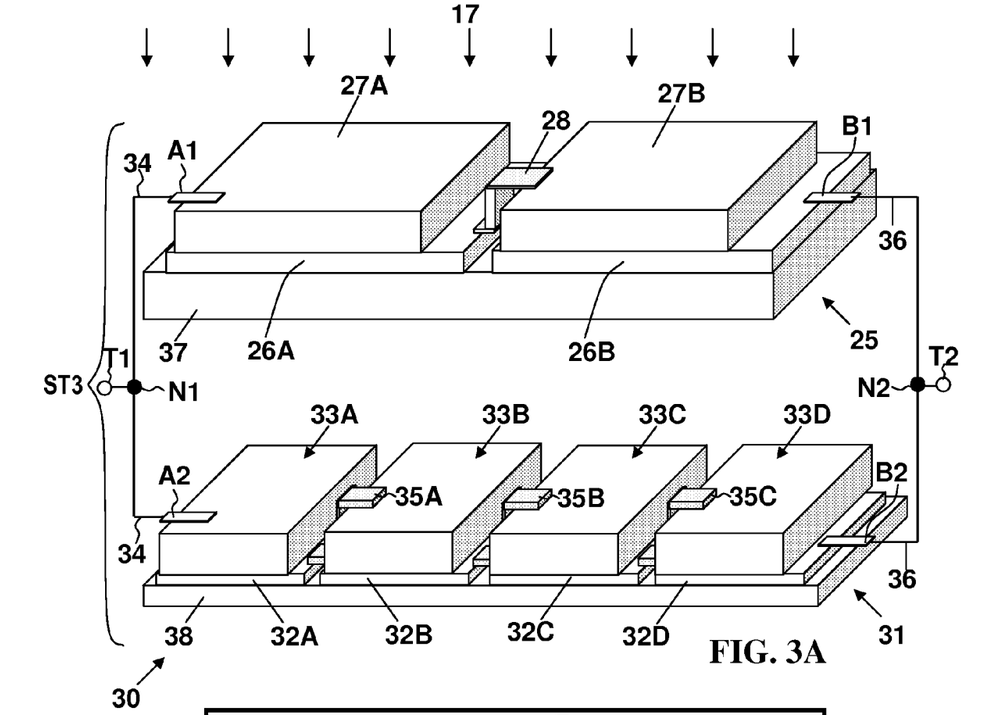
FIG. 3A shows a tandem energy conversion (TEC) solar cell device in accordance with this invention with upper and lower panels of solar cells in which the solar cells on each panel are connected in electrical series and with the panels connected in electrical parallel.
Figure 3B:
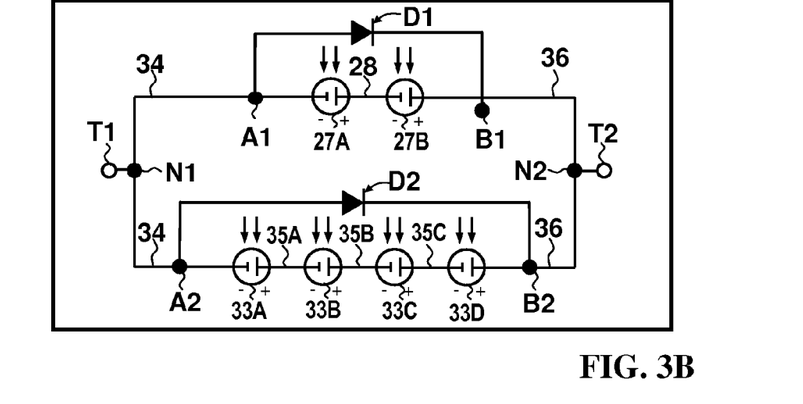
FIG. 3B is an electrical circuit diagram of the TEC solar cell device shown in FIG. 3A.

FIG. 3A shows another embodiment of a Tandem Energy Conversion (TEC) solar cell device 30 comprising a stack ST3 of two solar cell panels consisting of an upper panel 25 and a lower panel 31, in which the separate solar cells on the upper panel 25 are connected in a first set of electrical series connections. The separate solar cells on the lower panel 31 are connected in a second set of electrical series connections. FIG. 3B is an electrical schematic circuit diagram of the TEC solar cell device 30 shown in FIG. 3A. As described below, the panels 25 and 31 are connected in electrical parallel between terminals T1 and T2 as shown in FIGS. 3A and 3B.

In FIG. 3A, the upper panel 25 contains two separate solar cells 27A and 27B which are diodes with bottom electrodes and top electrodes and connected is series by an interconnect 28, as described in more detail below. Each of the separate solar cell diodes 27A and 27B is formed directly on the top surface of a respective one of two separate electrical conductor Transparent Conducting Oxide (TCO) pads 26A and 26B which are optically transparent. In turn the two TCO separate pads 26A and 26B are shown to be formed side by side directly on and in mechanical contact with the top surface of a first, upper, transparent dielectric substrate 37. The TCO pads 26A and 26B are used as electrodes to make electrical connections from the bottom electrode of the respective one of the separate solar cells 27A and 27B to the next element in the circuit. An electrically conductive interconnect 28 connects the TCO pad 26A on the left to the top electrode of the right hand solar cell 27B so that the two juxtaposed and separate solar cell diodes 27A and 27B on the upper panel 25, are connected in electrical series. In particular, the bottom electrode of the left hand solar cell diode 27A is connected through direct electrical and mechanical contact with the top surface of the left hand TCO pad 26A which is connected electrically and mechanically to the interconnect 28 which in turn is connected electrically and mechanically to the top electrode of the right hand solar cell diode 27B which is juxtaposed the with solar cell diode 27A.

In short, on the upper panel 25, the bottom electrode of the left hand solar cell diode 27A is connected electrically to the top electrode of the adjacent, right hand, solar cell diode 27B through the left hand TCO pad 26A which connects electrically to the interconnect 28. Thus, the voltages of the two solar cell diodes 27A and 27B, which are connected in series, add together. The terminal T1 is connected electrically by electrical line 34 to a connector A1, which is connected by direct electrical and mechanical contact to the top electrode of the left hand solar cell diode 27A. The bottom electrode of the right hand solar cell diode 27B is connected by direct electrical and mechanical contact with the top surface of the right hand TCO pad 26B which is connected by direct electrical and mechanical contact to the connector B1 which in turn is connected electrically by electrical line 36 to the right external terminal T2.

In FIG. 3A, the lower panel 31 contains a set of four separate solar cells 33A, 33B, 33C, and 33D, each of which is formed on the top surface of a respective one of a set of four separate TCO pads 32A, 32B, 32C, and 32D. Each of those four separate TCO pads 32A, 32B, 32C, and 32D, in turn, is shown to be formed directly on and in mechanical contact with the top surface of a bottom substrate 38. The separate solar cells 33A, 33B, 33C, and 33D are connected in electrical series by the TCO pads 32A, 32B, 32C, and 32D and a set of three electrically conductive interconnects 35A, 35B, and 35C in like manner to the connections described above on the upper panel 25. In the lower panel 31, the bottom of each of the separate cells 33A, 33B, and 33C from left to right is connected, in electrical series, respectively to the top of the adjacent solar cell 33B, 33C and 33D, juxtaposed therewith, on the right by the corresponding TCO pad 32A, 32B, or 32C and the corresponding electrically conductive interconnect 35A, 35B, or 35C. Thus, the voltages of the separate solar cells 33A, 33B, 33C, and 33D, which are connected in electrical series, also add together.

The left hand electrodes A1 and A2 of panels 25 and 31 are shown connected together electrically by electrical line 34 which connects both of them electrically to terminal T1. The right hand electrodes B1 and B2 of panels 25 and 31 are connected electrically together and to terminal T2 by line 36, which connects the panels 25 and 31 in electrical parallel. That makes the two panel TEC solar cell device 30 a two terminal device, as the panels 25 and 31 are connected together in electrical parallel. The voltages of each panel are made the same, This is carried out by making the number of solar cells connected in electrical series equal to the desired voltage output divided by the voltage output of the solar cells on each panel.

For example, if the desired voltage output is 16 volts, if the solar cell diodes 27A/27B on panel 25 have an output of 1 volt, then sixteen solar cells are connected in electrical series by interconnects 28, while if the solar cells 33 on the lower panel 31 have an output of 0.5 volt, then thirty-two cells 33 are connected in electrical series. Solar cell diodes 27A/27B, for example, might be GaAs with a 1 volt output and the solar cells 33 might be Si with a 0.5 volt output.

Three or more panel energy conversion devices such as those shown in FIG. 2 are constructed by the same principle in the sense that the number of cells connected in series is the total desired output voltage divided by the output voltages of the solar cells on each panel. A group of cells connected in series on each panel to create the desired total output voltage can be called a "unit" for the purposes of this invention. Each unit has the same voltage output and panels may contain multiple units. Units can be connected in parallel on each panel to obtain more current output.

As shown in the electrical schematic circuit diagram of FIG. 3B, the TEC solar cell device 30 may also incorporate an upper by-pass diode D1 for the upper panel of solar cells 27A/27B and a lower by-pass diode D2 for the lower panel of solar cells 33A/33B/33C/33D to protect the TEC solar cell device 30 in case a group of cells becomes shaded while the others remain exposed to sunlight.

Figure 4A:
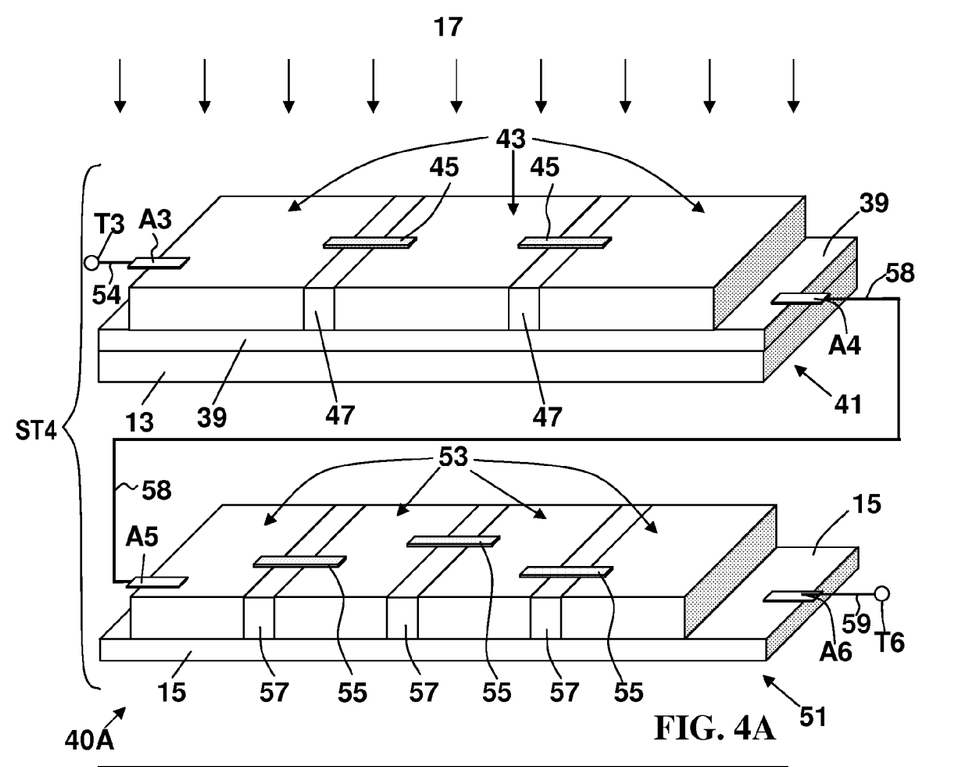
FIG. 4A shows an alternative arrangement of a Tandem Energy Conversion (TEC) solar cell device in accordance with this invention with upper and lower panels of solar cells in which the solar cells on each panel are connected in electrical parallel instead of electrical series and with the panels connected in series. The solar cells on each panel are spaced apart from each other by dielectric spacers.

Solar Cell Panels Connected in Series with Solar Cells on a Panel Separated by Dielectric Spacers FIG. 4A shows an alternative arrangement of a TEC solar cell device 40A comprising a stack ST4 of an upper panel 41 and a lower panel 51 including a set of the separate, upper solar cells 43 in the upper panel 41 and a set of separate, lower solar cells 53 in the lower panel 51 which solar cells in each panel are connected electrically in parallel instead of being connected electrically in series. On the other hand, as shown in FIG. 4A, the upper panel 41 and the lower panel 40 are connected in electrical series by an electrical wire line 58. The terminal T3 is connected by electrical wire line 54 to a connector A3, which is connected by direct electrical and mechanical contact to the top electrode of the left hand solar cell 43 in the upper panel 41. The bottom electrodes of all of the solar cells 53 are all connected by direct electrical and mechanical contact with the top surface of a lower conductive substrate 15, which is connected by direct electrical and mechanical contact to the connector A6, which in turn is connected electrically by electrical line 59 to terminal T6. However, as explained above, the upper panel 41 and the lower panel 40 are connected in electrical series.

Figure 4B:
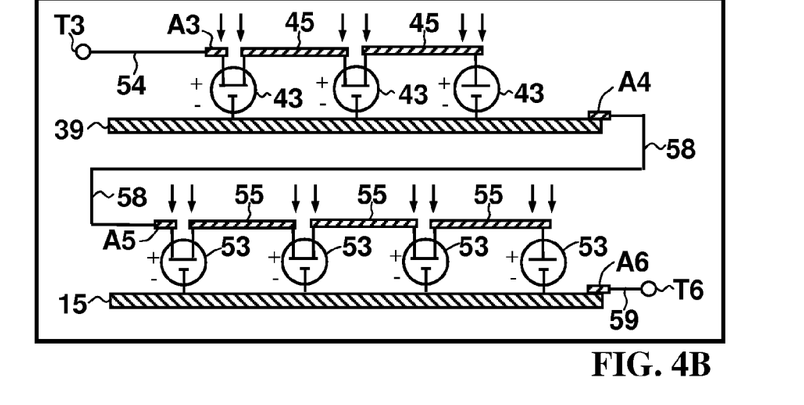
FIG. 4B is an electrical circuit diagram of the TEC solar device shown in FIG. 4A.

FIG. 4B is an electrical schematic circuit diagram of the TEC solar device 40A shown in FIG. 4A. The upper panel 41 and the lower panel 51 can be connected in electrical series. In this case, it is necessary to make the currents supplied by each panel the same. The upper panel 41 and the lower panel 51 are connected in series rather than in parallel in the finished energy conversion device and the voltage outputs of the two panels, i.e. upper panel 41 and the lower panel 51, add together.

In FIG. 4A, the upper panel 41 includes separate, upper solar cells 43 (which are diodes) separated by dielectric spacers 47 and the lower panel 51 includes separate, lower solar cells 53 (which are also diodes) separated by dielectric spacers 57. The upper solar cells 43 of the upper panel 41 have their lower electrodes mounted in direct electrical and mechanical contact with a TCO layer 39, which is formed on the top surface of a top transparent substrate 13, as in FIG. 1. Thus, sunlight of energy less than the bandgap of the upper solar cells 43 will be transmitted to the lower panel 51 and the lower solar cells 53. On the upper panel 41, the TCO conducting layer 39 provides electrical connections to the lower electrodes on the back sides of the upper solar cells 43, connecting them together Similarly, on the lower panel 51 a conductive substrate 15 on which the lower solar cells 53 are mounted connects the lower electrodes on the back sides of the lower solar cells 53 together electrically. The upper electrodes on the front sides of upper solar cells 43 and the upper electrodes on the front sides of the lower solar cells 53 are connected electrically in parallel by upper connectors 45 and lower connectors 55 respectively as indicated respectively in FIG. 4B. The upper electrodes of the solar cells 43 and 53 are shown with dual connections to the upper electrodes in view of the mechanical spacing between the connections points to the upper electrodes at each end of the A3 and the upper connectors 45 and the lower connectors 55.

Figure 4C:
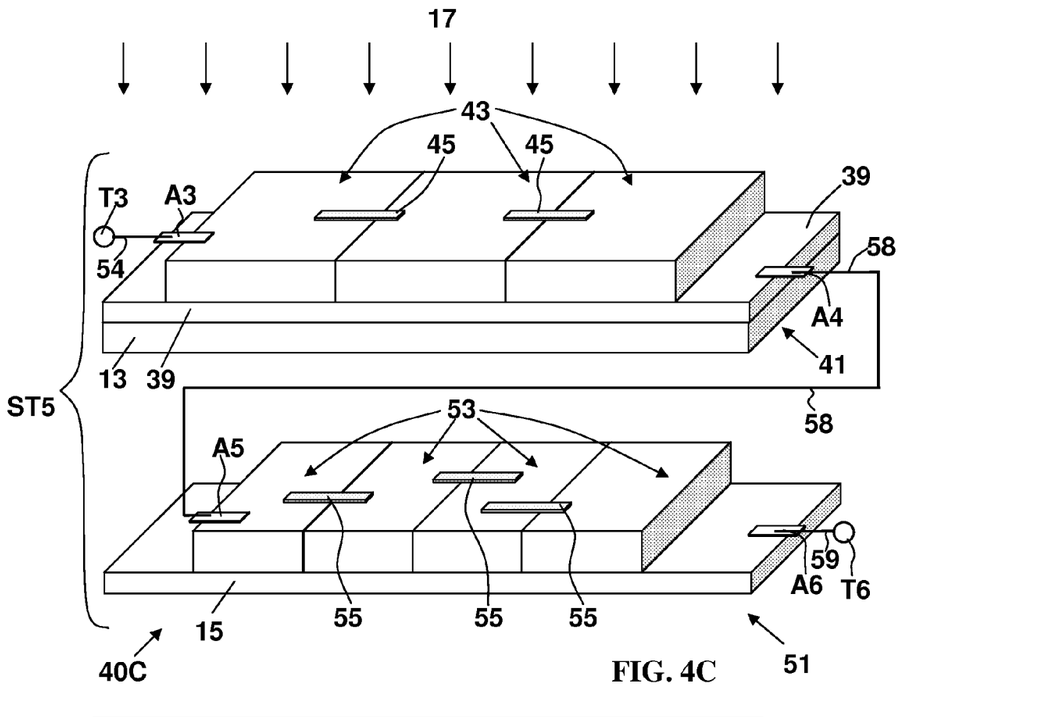
FIG. 4C is a modification of the TEC solar cell device of FIG. 4A with the solar cells of each panel butted up against each other with the panels connected in series.
Figure 4D:
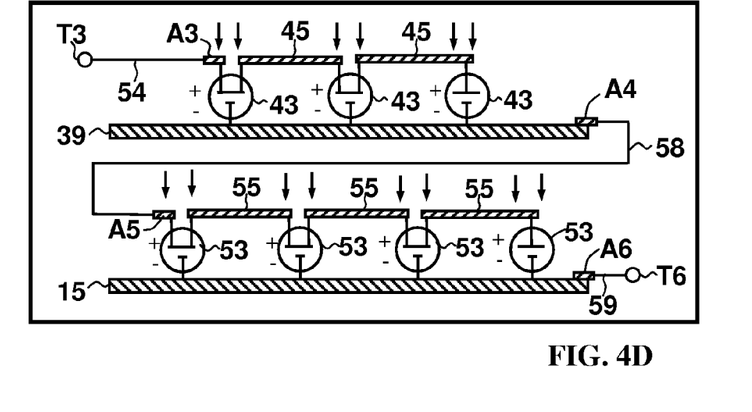
FIG. 4D is an electrical circuit diagram of the TEC solar device shown in FIG. 4C, which is identical to FIG. 4B, since the electrical connections have not been changed.

Solar Cell Panels Connected in Series Electrically with Cells in a Panel Butted Together FIGS. 4C and 4D show an alternative arrangement to FIGS. 4A and 4B in which the dielectric spacers 47 and 57 have been omitted so that the solar cells on the panels 41 and 51 are butted together, but otherwise the structures and the circuits are the same. As shown in FIG. 4C, the optional dielectric spacers 47 and 57 in the stack ST4 in FIG. 4A which isolate individual cells 43 and 53 respectively from adjacent cells have been omitted from the embodiment of the invention shown in FIG. 4C. As contrasted to FIG. 4A in FIG. 4C the stack ST5 comprises an alternative parallel connection of the solar cells 43 and 53 which are respectively butted up against each other. The circuit diagram shown in FIG. 4D is identical to FIG. 4B, since the electrical connections have not been changed.

FIG. 4C is a modification of the TEC solar cell device of FIG. 4A with the separate, solar cells of each panel butted up against each other without being separated by the dielectric spacers 47 of FIG. 4A, but being the same as FIG. 4A in that the panels are shown connected in electrical parallel. In the upper panel 41 of FIGS. 4A and 4C, the electrodes 45 on the top and TCO conducting layer 39 on the bottom are provided for connecting the upper solar cells 43 together in the upper panel 41 in electrical parallel between the terminals T3 and T4. In the lower panel 51, the electrodes 55 on the top and TCO conducting layer 15 on the bottom of the lower panel 51 are provided for connecting the lower solar cells 53 in the lower panel together in electrical parallel between the output terminals T5 and T6 on the lower conductive substrate 15.

In the lower panel 51, the lower connectors 55 on the top of the lower solar cells 53 and the conductive substrate 15 on the bottom of the lower panel 51 are provided for connecting the lower solar cells 53 in the lower panel together in parallel between the connector A5 on the upper left solar cell 53 and the connector A6 on the top surface of the right hand end of the lower substrate 16.

The connectors A3 and A4 of the upper panel 41 and the connectors A5 and A6 of the lower panel 51 are provided for connecting the upper panel 41 and the lower panel 51 together in series or in parallel. For example, as shown in FIGS. 4A, 4B, 4C and 4D the connectors A4 and A5 can be connected together to place the panels in electrical series, with the output voltage of the solar cell device 40A appearing across the connectors A3 and A6. Those combinations determine which are the externally connected, i.e. output, electrodes of the energy conversion device.

Each panel must have the same current output in order for the panels to be connected in electrical series. The number of cells which need to be connected in parallel on each panel is the total output current divided by the current output of each cell. For example, if each panel is intended to provide an output current of six (6) amperes, twelve (12) cells are connected in parallel if each cell outputs 0.5 amperes, and fifteen (15) cells are connected in parallel if each cell outputs 0.4 amperes.

Solar Cell Panels Connected in Parallel with Cells in a Panel Butted Together

Figure 4E:
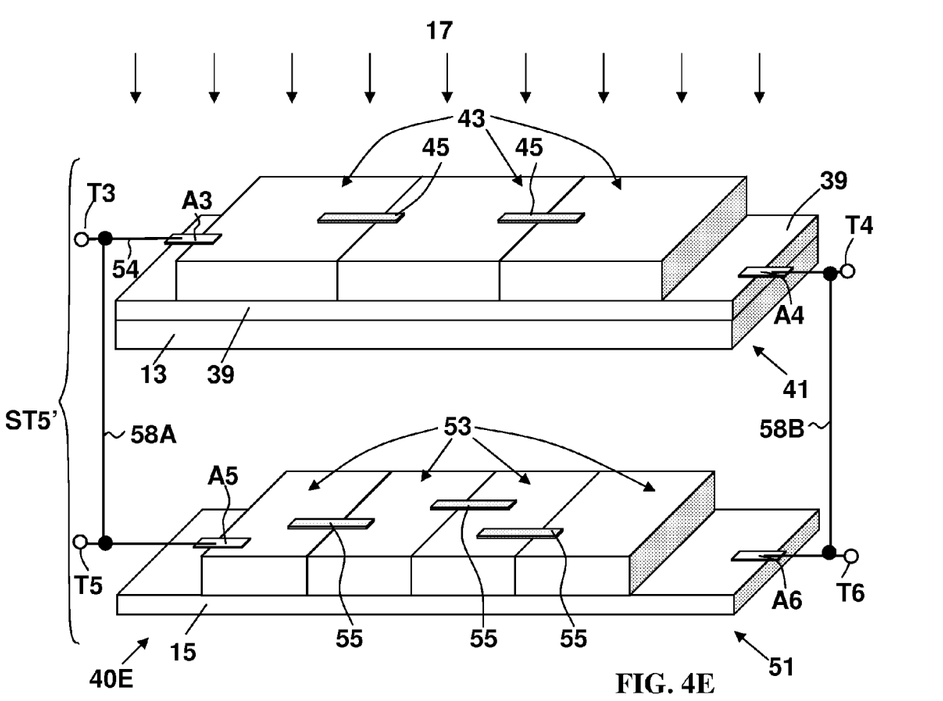
FIG. 4E is a modification of the TEC solar cell device of FIG. 4C, with the solar cells of each panel butted up against each other and with the panels connected in parallel.
Figure 4F:
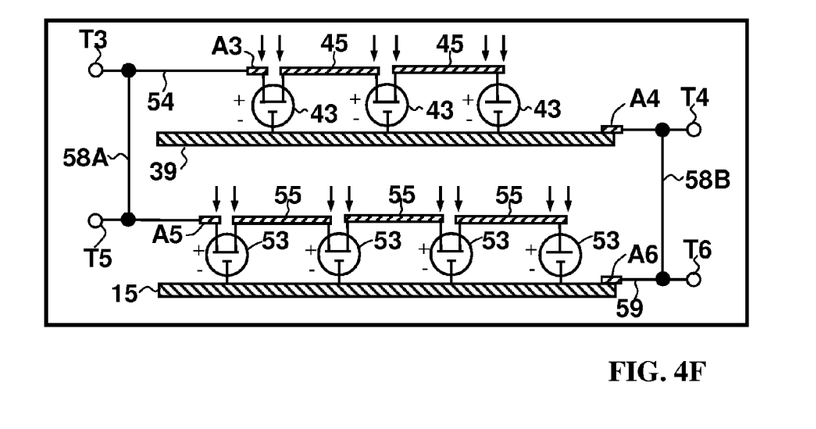
FIG. 4F shows a circuit diagram for the TEC solar cell device of FIG. 4E showing the parallel electrical connections of the panels.

Alternatively, as will be well understood by those skilled in the art, FIGS. 4E and 4F, are modifications of FIGS. 4C and 4D. FIG. 4E is a modification of the TEC solar cell device of FIG. 4C, with the separate, solar cells 43 and 53 of each panel 41 and 40 respectively butted up against each other and with the panels 41 and 40 connected in electrical parallel by wires 58A and 58B. FIGS. 4E and 4F show the terminals T3 and T5 connected together by line 58A and the terminals T4 and T6 connected together by line 58B to place the panels 41 and 51 in electrical parallel.

Each such group of parallel-connected solar cells which outputs a desired current can be considered a unit. Panels may contain multiple units, each of which has the same current output. Units on each panel can be connected in series to add voltages at a substantially constant current, or further connected in parallel to obtain more current at a substantially constant voltage. Each unit may also incorporate a by-pass diode to protect the unit in case a group of cells becomes shaded from sunlight while the others remain exposed to sunlight.

Figure 5A:
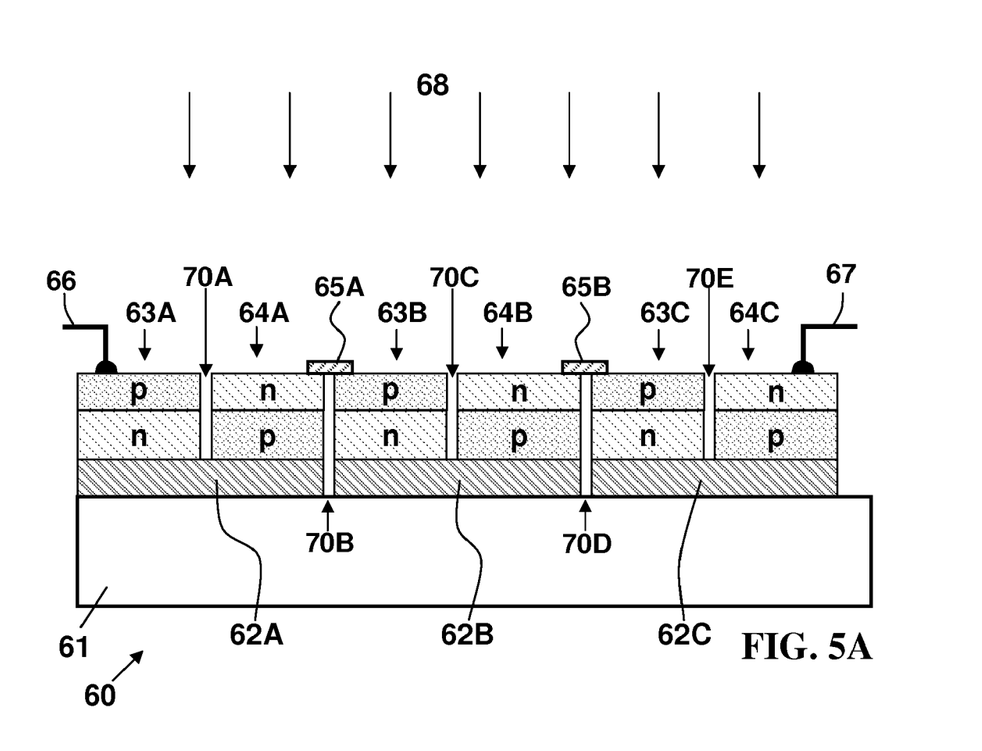
FIG. 5A shows a tandem energy conversion (TEC) solar cell device in accordance with this invention in which the solar cells of alternate p/n and n/p variety are connected in electrical series.
Figure 5B:
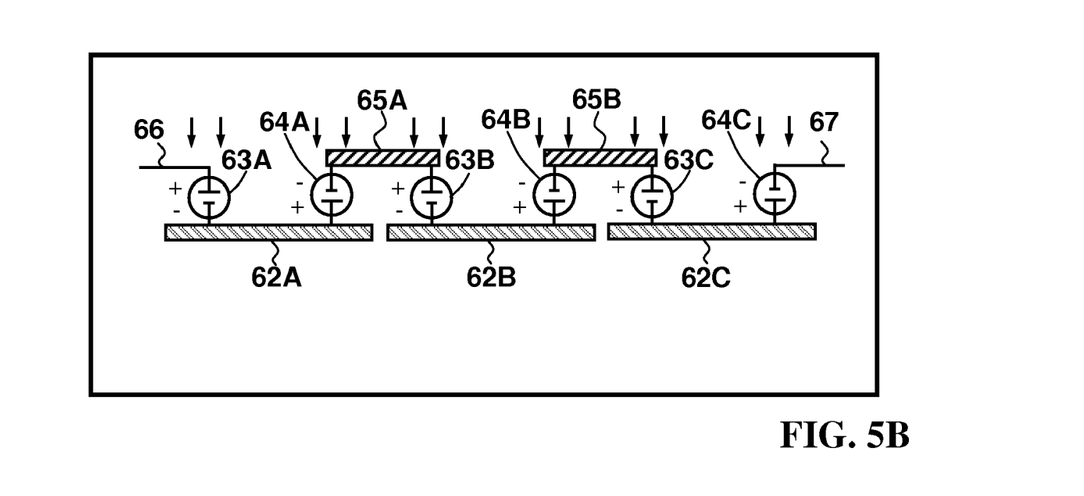
FIG. 5B is a circuit diagram of the TEC solar cell device of FIG. 5A.

Solar Cell Panel with Adjacent Solar Cells Physically Inverted and Connected in Series FIG. 5A shows a tandem energy conversion (TEC) solar cell device in accordance with this invention in which the solar cells of alternate p/n and n/p variety are connected in electrical series. FIG. 5B shows the circuit diagram of the TEC solar cell device shown in FIG. 5A. FIG. 5A shows an alternating series connection of a set of solar cells 63A, 64A, 63B, 64B, 63C and 64D on a panel 60 including a first set of p-n solar cells 63A, 63B, and 63C which are diodes and a second set of upside down, i.e. physically inverted, n-p solar cells 64A, 64B, and 64C which are also diodes formed on a set of three TCO pads 62A, 62B and 62C.

The solar cells 63A, 64A, 63B, 64B, 63C and 64D are juxtaposed on the top surface of a substrate 61 which will be transparent in a case in which there are other solar cell panels therebelow (not shown for convenience of illustration.) The polarities of the successive juxtaposed first set of solar cells 63A, 63B, 63C and the second set of solar cells 64A, 64B, 64C alternate from p/n junctions, to n/p junctions, to p/n junctions, to n/p junctions, etc., because the polarities thereof are reversed from top to bottom. In other words panel 60 consists of several solar cells 63A, 63B, and 63C having p-type top surfaces and n-type bases which are juxtaposed with solar cells 64A, 64B, 64C that have n-type top surfaces and p-type bases, etc.

The conductive TCO pads 62A, 62B, and 62C add the voltages of adjacent cells and connecting electrodes 65A and 65B add the voltages of adjacent pairs of cells 64A and 63B located on TCO pads 62A and 62B and adjacent pairs of cells 64B and 63C located on TCO pads 62B and 62C.

External electrodes 66 and 67, which are provided for external connection to the panel 60, are connected to cell 63A and cell 64C respectively. The anode of cell 63A is connected to the external electrode 66 and the cathode of cell 63A is connected and bonded to the TCO layer 62A. The anode of cell 64A is connected and bonded to the TCO layer 62A and the cathode of cell 64A is connected to the connecting electrodes 65A. In turn, the anode of cell 63B is connected to the connecting electrode 65A and the cathode of cell 63B is connected to and bonded to the TCO layer 62B. The anode of cell 64B is connected and bonded to the TCO layer 62B and the cathode of cell 64B is connected to the connecting electrode 65B. In turn, the anode of cell 63C is connected to the connecting electrode 65B and the cathode of cell 63C is connected and bonded to the TCO layer 62C. The anode of cell 64C is connected and bonded to the TCO layer 62C and the cathode of cell 64B is connected to the external electrode 67. FIG. 5B shows the connections of the devices between the external electrodes 66 and 67 as described in detail above.

Each panel in a stack of panels, such as panel 60 in FIG. 5A, contains a number of cells connected in series equal to the desired total output voltage of the panel divided by the output voltage of each cell.

For example, the panel 60 may contain groups of sixteen cells outputting one volt at a substantially constant current and a second panel may contain groups of thirty-two cells each outputting 0.5 volt at a substantially constant current. A group of such cells connected in series to obtain a desired voltage output represents a unit. Panels may contain multiple units connected in series for higher voltage output or parallel for higher current output or a combination of series and parallel. By-pass diodes can be incorporated with each unit or group of units to protect the unit against partial sunlight shading. Bypass diodes can also be used with groups of cells within a unit to protect the group against partial sunlight shading.

Tandem Energy Conversion (TEC) devices, consisting of panels connected in parallel to each other which then have the same voltage output, have an advantage over panels connected in series that require equal current outputs. As the incident solar spectrum changes over the day and over the year, the current outputs of a set of series connected panels changes linearly with changes in the spectrum, while the voltage outputs of parallel-connected panels change logarithmically with spectrum changes, making the parallel panel connection less sensitive to such solar spectrum changes than the series panel connection.

It will be clear to one skilled in the art that combinations of series and parallel connections both of solar cells on each panel and the panels themselves can be made to effect the desired result of voltage and current output.

A significant feature of the invention is the placing of panels of solar cells in optical series such that each panel absorbs a fraction of the incident solar spectrum and transmits the rest, then connecting the panels in electrical series (where each panel must output the same current) to add their voltage outputs or in electrical parallel (where each panel must output the same voltage output) to add their current outputs.

An added benefit of fabricating each panel separately and combining them at the finish of the fabrication process is that each solar cell can be manufactured separately and therefore using optimized processes, taking into account that each material may need different process conditions such as temperature, thickness, type of surface coatings if any, and so forth. The optimized solar cell panels are then combined to realize the high performance/efficiency of the tandem approach.

While the invention foregoing description describes exemplary specific embodiments of the present invention in terms, those skilled in the art will recognize that the invention can be practiced with modifications within the spirit and scope of the appended claims, i.e. changes can be made in form and detail, without departing from the spirit and scope of the invention. Modifications of the above disclosed apparatus and methods which fall within the scope of the invention will be readily apparent to those of ordinary skill in the art.

Accordingly, while the present invention has been disclosed in connection with the above exemplary embodiments thereof, it should be understood that changes can be made to provide other embodiments which may fall within the spirit and scope of the invention and all such changes come within the purview of the present invention and the invention encompasses the subject matter defined by the following claims.

What is claimed is:

1. A solar energy conversion device comprising:
a vertical stack of at least two solar cell panels stacked in a hierarchy from an upper solar cell panel to at least one lower solar cell panel;
each of said solar cell panels including, respectively, an upper and a lower matching array of solar cells with each said solar cell of each said array having a different energy bandgap from energy bandgaps of solar cells in other solar cell panels in said vertical stack;
said upper solar cell panel comprising a transparent, dielectric, upper substrate supporting said upper matching array of solar cells and a plurality of upper optically transparent electrical conductors, each of said upper optically transparent electrical conductors comprising an upper Transparent Conducting Oxide (TCO) pad formed directly on said substrate with each said upper TCO pad having thereon one solar cell of said upper matching array of solar cells and forming an upper TCO pad and upper solar cell pairs, and each said upper solar cell has a top electrode and a bottom electrode;
each said bottom electrode of each said upper solar cell being in electrical and mechanical contact with a said upper TCO pad;
said upper solar cells being connected in electrical series by an upper electrically conductive interconnect wherein an upper TCO pad of a first upper TCO pad and upper solar cell pair is connected via said upper electrically conductive interconnect to an upper to electrode of an upper solar cell of an adjacent said upper TCO pad and upper solar cell pair;
said at least one lower solar cell panel positioned below said upper panel with said at least one lower solar cell panel comprising a lower substrate and said lower matching array of solar cells wherein each said lower solar cell has a bottom electrode and an upper electrode, wherein each said lower solar cell is formed on a separate lower TCO pad forming a lower TCO pad and lower solar cell pairs, and wherein each lower TCO pad is between each of said lower solar cells and said lower substrate;

said lower solar cells being connected in electrical series by a lower electrically conductive interconnect wherein a lower TCO pad of a first said lower TCO pad and a lower solar cell pair is connected via said lower electrically conductive interconnect to a lower top electrode of a lower solar cell of an adjacent said lower TCO pad and said lower solar cell pair;

wherein said upper solar cells have a higher enemy bandgap than said lower solar cells;

a top surface of said device provided for receiving solar energy incident upon said upper solar cell panel; and said upper solar cell panel absorbing a fraction of sunlight having photon energies larger than the enemy bandgaps of said at least one lower solar panel.

2. The energy conversion device of claim 1 wherein
said upper solar cells are connected electrically in series;
said lower solar cells are connected electrically in series; and
said upper and said at least one lower solar cell panels are connected electrically in parallel.

3. The energy conversion device of claim 1 wherein the number of said solar cells on each of said solar cell panels connected in a series electrically is equal to a desired output voltage of each said solar cell panel divided by respective operating voltages of each of said solar cells on each said solar cell panel.

4. The energy conversion device of claim 3 wherein said upper solar cells comprise GaAs solar cells and said lower solar cells comprise silicon solar cells.

5. The energy conversion device of claim 3 wherein said upper matching array of solar cells is GaAs, GaInP, GaAsP, amorphous silicon, CdTe, or CdZnTe; and
said lower matching array of solar cells is crystalline silicon, polycrystalline silicon, copper indium gallium diselenide, germanium, gallium indium nitride, or gallium indium arsenide nitride.

6. The energy conversion device of claim 1 wherein said upper solar cell panel transmits solar photons with photon energies less than the energy bandgap of said matching array of upper solar cells to said at least one lower solar cell panel lower in said hierarchy and positioned lower in said stack.

7. The energy conversion device of claim 6 wherein said solar cells in each said solar cell panel are connected electrically in series and said solar cell panels are connected in parallel.

8. The energy conversion device of claim 7 wherein the number of said solar cells on each of said solar cell panels connected in series is equal to a desired output voltage of each said solar cell panel divided by operating voltage of each said solar cells on each said solar cell panel.

9. The energy conversion device of claim 6 wherein said upper solar cells comprise GaAs solar cells and said lower solar cells comprise silicon solar cells.

10. The energy conversion device of claim 6 wherein said upper matching array of solar cells is GaAs, GaInP, GaAsP, amorphous silicon, CdTe, or CdZnTe, and said lower matching array of solar cells is crystalline silicon, polycrystalline silicon, copper indium gallium diselenide, germanium, gallium indium nitride, or gallium indium arsenide nitride.

11. The energy conversion device of claim 6 wherein a protective by-pass diode is included with each said solar cell panel.

* * * * *